(12) United States Patent
Nakhkoob et al.

(10) Patent No.: US 9,667,351 B2
(45) Date of Patent: May 30, 2017

(54) SIMULTANEOUS BANDWIDTH EXTENSION AT HIGH GAIN AND PEAKING REDUCTION AT MINIMUM GAIN FOR WIDEBAND, VARIABLE GAIN, LINEAR OPTICAL RECEIVERS

(71) Applicant: Avago Technologies General IP (Singapore) Pte. Ltd., Singapore (SG)

(72) Inventors: Behrooz Nakhkoob, San Jose, CA (US); Georgios Asmanis, Lake Forest, CA (US); Faouzi Chaahoub, San Jose, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 14/927,738

(22) Filed: Oct. 30, 2015

(65) Prior Publication Data

US 2017/0126190 A1    May 4, 2017

(51) Int. Cl.
*H04B 10/69* (2013.01)
*H04B 10/25* (2013.01)
*H03G 3/30* (2006.01)
*H03F 3/08* (2006.01)

(52) U.S. Cl.
CPC ............. *H04B 10/693* (2013.01); *H03F 3/08* (2013.01); *H03G 3/3084* (2013.01); *H04B 10/25* (2013.01)

(58) Field of Classification Search
CPC ................. H03G 3/3084; H03F 3/082; H04B 10/6931–10/6933; H04B 10/69
See application file for complete search history.

(56) References Cited

U.S. PATENT DOCUMENTS

| 7,459,972 B2 | 12/2008 | Aram et al. |
| 8,787,774 B2 | 7/2014 | Guckenberger |
| 8,836,423 B2 | 9/2014 | Lavasani |
| 2002/0070802 A1* | 6/2002 | Kim ..................... H03G 1/0023 330/133 |
| 2013/0256542 A1* | 10/2013 | Soh ........................ G01T 1/247 250/370.09 |

OTHER PUBLICATIONS

Sano et al., "Photodiodes and Transimpedance Amplifiers for 100-Gbit/s Digital Coherent Optical Communications", NTT Technical Review, vol. 9 No. 3, Mar. 2011, 6 pages.

* cited by examiner

*Primary Examiner* — David Payne
*Assistant Examiner* — Casey Kretzer
(74) *Attorney, Agent, or Firm* — Sheridan Ross P.C.

(57) ABSTRACT

An optical communication system, a linear optical receiver, and an Integrated Circuit (IC) chip are disclosed, among other things. One example of the disclosed IC chip includes a transimpedance amplifier that receives an input electrical signal from a photodiode and provides an amplified version of the input electrical signal as an output, at least one variable gain amplifier that receives the amplified electrical signal output by the transimpedance amplifier and a bandwidth control mechanism that extends a bandwidth of the second amplified output at a maximum gain of the second amplification phase and also reduces a peaking of the second amplified output at a minimum gain of the second amplification phase.

20 Claims, 9 Drawing Sheets

SIMULTANEOUS BANDWIDTH EXTENSION AT HIGH GAIN AND PEAKING REDUCTION AT MINIMUM GAIN FOR WIDEBAND, VARIABLE GAIN, LINEAR OPTICAL RECEIVERS

FIELD OF THE DISCLOSURE

The present disclosure is generally directed toward amplifiers and their use in various types of systems such as optical communication systems.

BACKGROUND

There exists an ever increasing demand for larger data rates, especially in optical communication systems. This demand is being pushed mostly by rapidly growing data centers and the Cloud. The technical difficulty in design and fabrication of wideband photodiodes and laser diodes for both 850 nm Short Reach (SR), and 1.3 μm Long Reach (LR) applications, however, suggest utilizing more bandwidth efficient modulation techniques such as Pulse Amplitude Modulation (PAM) (e.g., PAM-4) and Quadrature Phase Shift Keying (QPSK) for heterodyne receivers, in which a linear gain/phase Trans-Impedance Amplifier (TIA) is required. Many of these techniques inherently have variations in the incoming light power shined on the photodiode resulting from different losses in the fiber link as well as the fluctuation of the laser output power. Because of this, a Variable Gain Amplifier (VGA) is required in such linear receivers to keep the peak-to-peak output voltage substantially constant. Depending on link budget for different applications, the gain of the receiver might change by 30 dBΩ, resulting in significant bandwidth limitation at high gain, and large peaking at minimum gain. This results in a significant detriment in the quality of the received eye.

BRIEF DESCRIPTION OF THE DRAWINGS

The present disclosure is described in conjunction with the appended figures, which are not necessarily drawn to scale.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, circuit configurations, manufacturing techniques and/or tolerances, are to be expected. Thus, the various aspects of the present disclosure presented throughout this document should not be construed as limited to the particular circuit elements illustrated and described herein but are to include deviations in circuits and functionally-equivalent circuit components.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

Figure 1:
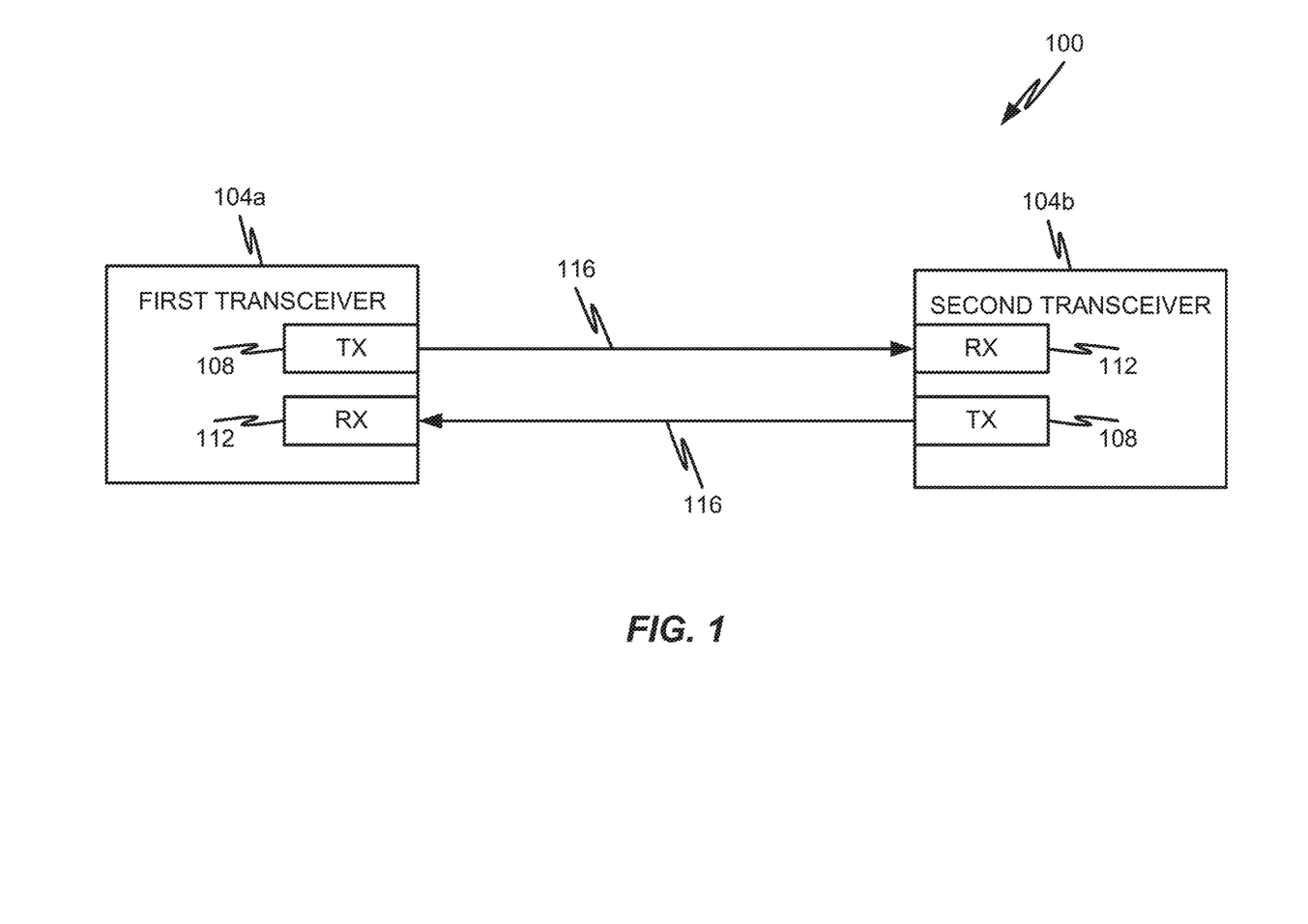
FIG. 1 is a block diagram depicting an optical communication system in accordance with at least some embodiments of the present disclosure.
Figure 2:
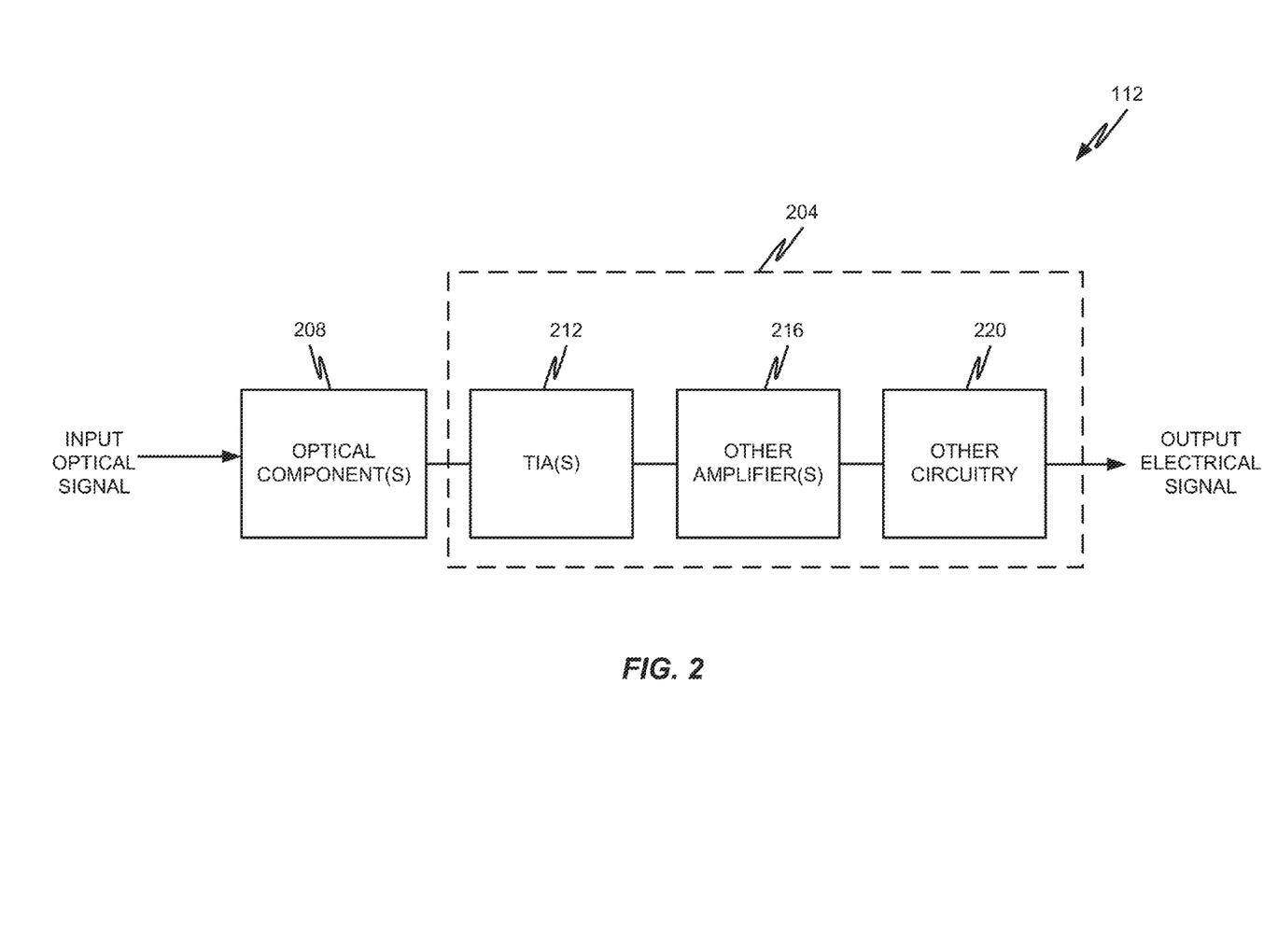
FIG. 2 is a block diagram depicting an optical receiver in accordance with at least some embodiments of the present disclosure.

With reference now to FIGS. 1 and 2, an illustrative communication system 100 in which embodiments of the present disclosure may be utilized will be described. The system 100 is shown to include one or more transceivers 104a, 104b, each having a transmitter 108 and a receiver 112. The transceivers 104a, 104b are shown to communicate with one another via one or more communication channels 116 that connect a transmitter 108 with a receiver 112. It should be appreciated that embodiments of the present disclosure may also be implemented in a communication system having dedicated transmitters 108 and receivers 112 instead of a combination of a transmitter 108 and receiver 112 being implemented in a transceiver 104.

In a specific, but non-limiting example of the communication system, signals carried between the transmitter 108 and receiver 112 are transmitted at a relatively high bit rate (e.g., 10 Gbps, 25 Gbps, or greater) using a modulation technique that doubles the achievable data rate for a given link bandwidth. More specific types of modulation techniques that may be used in the communication system 100 include, without limitation, a Pulse Amplitude Modulation (PAM)-4 modulation scheme (or a QAM-16 or QAM-64 modulation scheme).

The receiver 112, as further depicted in FIG. 2, is configured to receive an input optical signal and produce an output electrical signal using the combined functionality of the optical component(s) 208 and Analog Front End (AFE) 204. Although certain components are depicted as being included in the AFE 204, it should be appreciated that embodiments of the present disclosure are not limited to the depicted configuration of components.

Although embodiments of the present disclosure will be described in connection with circuitry for an optical communication system having a variable gain amplifier and transimpedance amplifier, it should be appreciated that embodiments of the present disclosure are not so limited. To the contrary, any circuit element exhibiting a behavior that can benefit from some type of distortion-improvement scheme disclosed herein could utilize embodiments of the present disclosure. Furthermore, embodiments of the present disclosure are not limited to communication systems or optoelectronic components of communication systems. Instead, embodiments of the present disclosure can be used in a wide variety of environments including computing applications, server applications, data centers, etc.

In some embodiments, some or all of the components included in the receiver 112 or the AFE 204 may be provided on an Integrated Circuit (IC) chip or a collection of IC chips. The IC chip implementing the various components of the AFE 204 may correspond to an Application Specific IC (ASIC) chip or the like. In some embodiments, the TIA(s) 212, other amplifiers 216, and other circuitry 220 may be entirely implemented in an IC chip whereas the optical component(s) are not or are implemented on a different IC chip. In other embodiments, the TIA(s) 212 and other amplifier(s) 216 may be implemented on an IC chip whereas the other circuitry 220 may be implemented on a separate IC chip or as discrete circuit components connected to a Printed Circuit Board (PCB).

Figure 3:
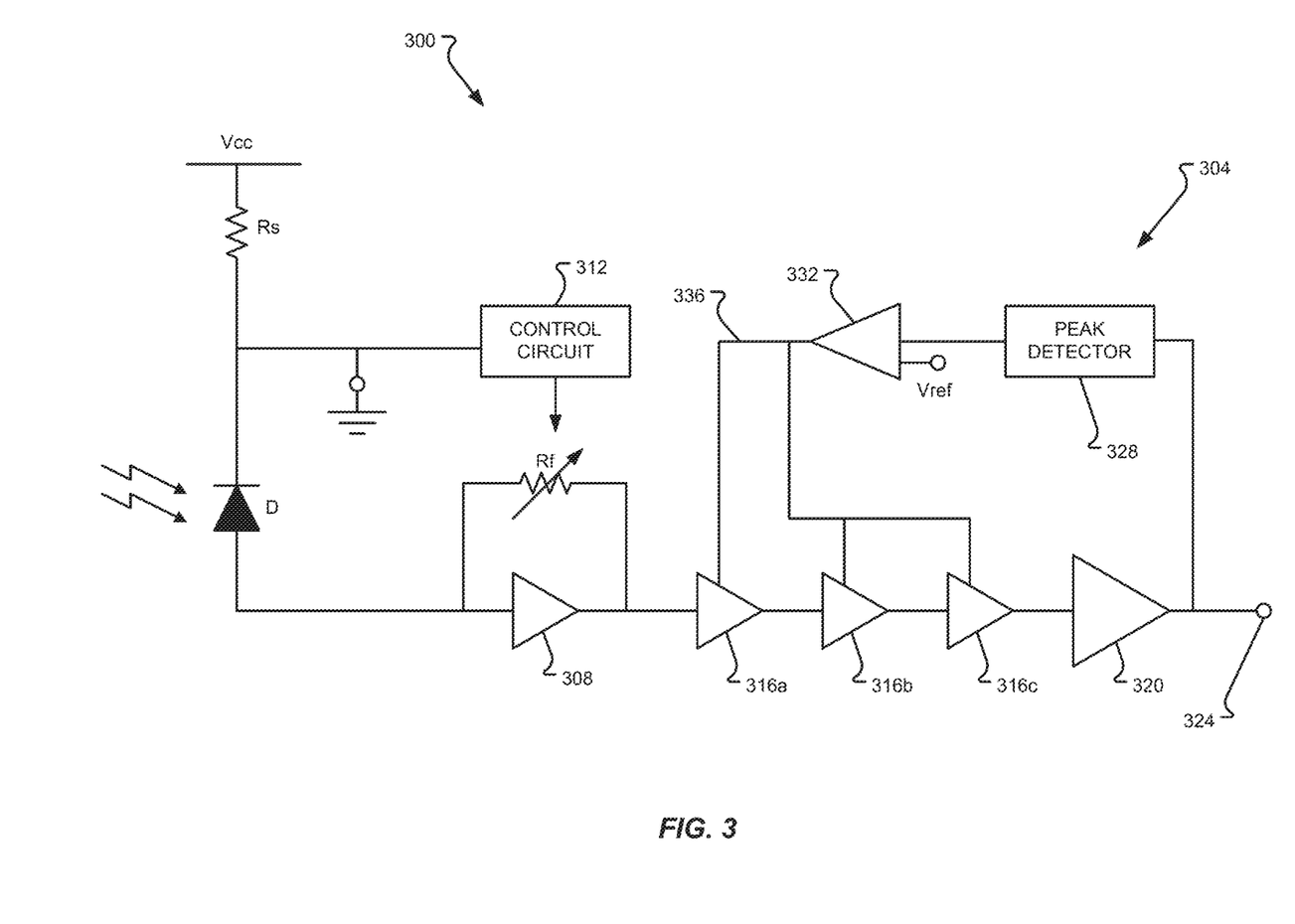
FIG. 3 is a circuit diagram depicting an illustrative receiver circuit in accordance with at least some embodiments of the present disclosure.

As will be discussed in further detail herein, an approach is presented herein in which the TIA's 212 bandwidth and linearity are greatly improved. With reference now to FIG. 3, additional details of a circuit 300 which may be included as part of the AFE 204 will be described in accordance with at least some embodiments of the present disclosure. The circuit 300 is shown to include a photodiode D, a first amplifier 308, a plurality of second amplifiers 316a-c, an output driver 320, a gain control loop 304, an amplifier control circuit 312, and a circuit output 324. In this figure we have to add the VGA as one of the amplifier with the control circuits.

The photodiode D may correspond to one example of an optical component 208. The photodiode D may be biased by input voltage Vcc connected to the photodiode D through a supply resistor Rs.

The first amplifier 308 may correspond to an example of the TIA 212 and may further correspond to a first amplification stage of the circuit 300. In addition to including the amplifier itself, the TIA 212 may also include a feedback resistor Rf connected between an input and an output of the first amplifier 308. The feedback resistor Rf may include a static resistance or a controllable feedback network that is controlled by control circuit 312. In some embodiments, the control circuit 312 may comprise one or more control elements that adjust the feedback resistor Rf or other values of feedback components in the feedback loop of the first amplifier 308.

The output of the first amplifier 308 is provided to the series of second amplifiers 316a, 316b, 316c, which may correspond to examples of other amplifiers 216. Some or all of the second amplifiers 316a, 316b, 316c may also be considered a second amplification stage of the circuit 300, either individually or collectively. In some embodiments, the amplifiers 316a-c comprise variable gain amplifiers that are each controlled with a gain control voltage 336 output by an integrator 332 and peak detector 328 in the gain control loop 304. Specifically, the variable gain amplifiers 316a-c may have their control voltage adjusted as the output signal 324 changes over time. The change in the control voltage 336 may be implemented by the peak detector 328 detecting peaks and/or valleys in the output signal 324 and then provided information about such detected peaks and valleys to the integrator 332. The integrator 332 may integrate the output of the peak detector 328 with a reference voltage Vref, which may correspond to a predetermined reference or threshold voltage. In other words, if the peak detector 328 detects peaks of the output signal 324 to exceed the reference voltage Vref, then the integrator 332 may adjust the control voltage 336, thereby altering the amount of gain applied by the variable gain amplifiers 316a-c.

Although FIG. 3 shows a series of three variable gain amplifiers, it should be appreciated that a greater or lesser number of variable gain amplifiers 316a-c can be incorporated into the circuit 300 without departing from the scope of the present disclosure. Furthermore, the configuration of variable gain amplifiers 316a-c may be the same or they may be different from one another without departing from the scope of the present disclosure.

The output driver 320 may correspond to an example of other circuitry 220. In some embodiments, the output driver 320 receives the output from the plurality of variable gain amplifiers 316a-c and produces the output signal 324. The output driver 320 may include a 50 ohm output driver having two pairs of differential transistors connected to one another in a known fashion.

Figure 4:
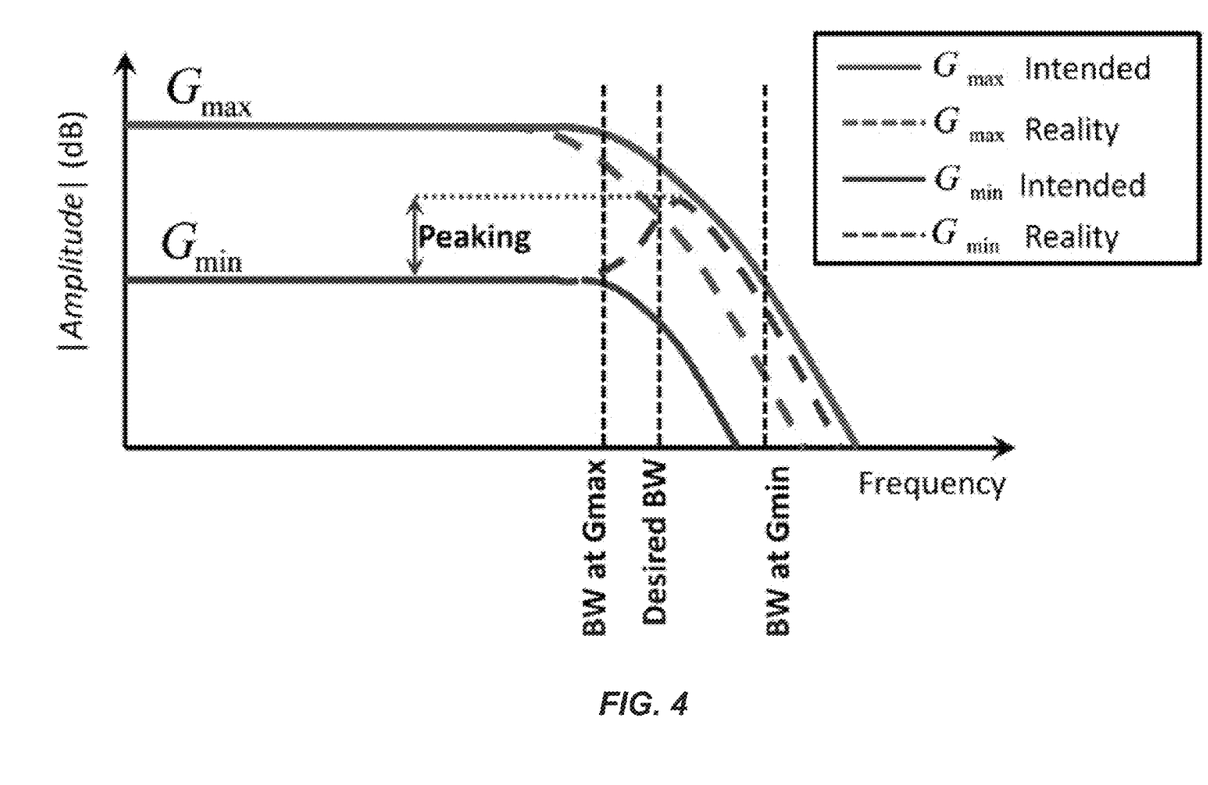
FIG. 4 is a chart illustrating the frequency response of a linear optical receiver showing the undesirable impact on receiver frequency response at different gain values.

As discussed herein above, a conventional circuit 300 used in a communication system, such as the optical communication system 100 may have to be configured to accommodate fluctuations in laser/light source output power. In particular, when a signal is received at the photodiode D having a relatively high power, there is usually a need for minimum gain Gmin as shown in FIG. 4. On the other hand, when the received signal has a relatively low power, then there is a need for using an amount of gain closer to the maximum gain Gmax. As can be seen in FIG. 4, however, the reality of the circuits 300 frequency response when operating between the extremes of the minimum gain Gmin and maximum gain Gmax is that there is undesired peaking (at minimum gain Gmin) and bandwidth losses (at maximum gain Gmax).

It is, therefore, one aspect of the present disclosure to provide a solution that simultaneously mitigates both negative effects. In other words, a solution is provided herein that extends the bandwidth of the receiver at high/maximum gain conditions while also reducing peaking at low/minimum gain conditions.

Figure 5A:
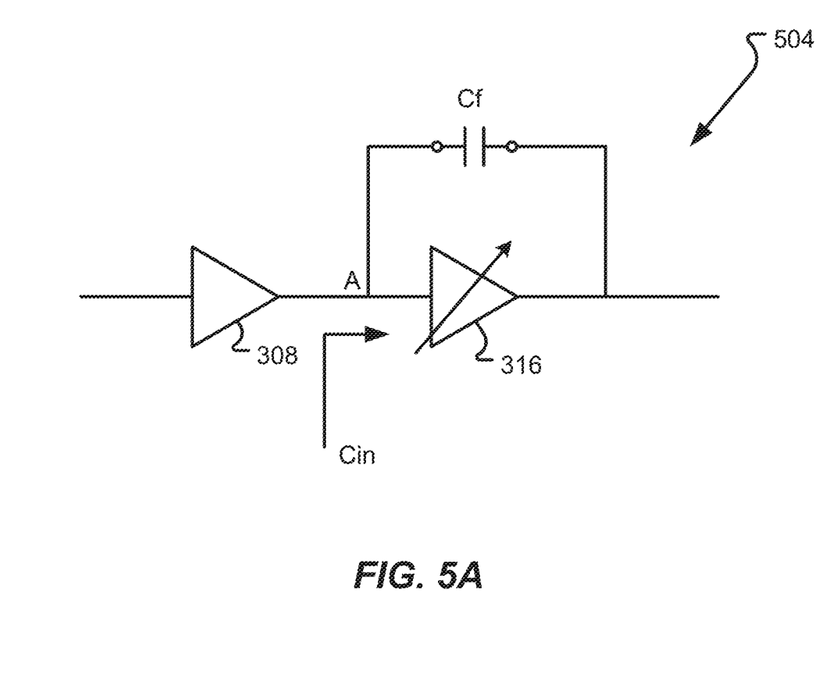
FIG. 5A is a circuit diagram depicting an illustrative circuit for curtailing the undesired frequency response shown in FIG. 4 in accordance with at least some embodiments of the present disclosure.

In particular, and with reference now to FIGS. 5A-D, various configurations of a circuit 504 (or circuit portion) used to simultaneously combat the negative effects at high and low gain conditions for a linear optical receiver will be described in accordance with at least some embodiments of the present disclosure. With reference initially to FIG. 5A, a first configuration of the circuit 504 is shown whereby a feedback capacitance Cf is introduced into a positive feedback loop of one of the variable gain amplifiers 316. It should also be appreciated that the feedback capacitance Cf may be introduced across the VGA without departing from the scope of the present disclosure. Although the feedback capacitance Cf is depicted as being provided by a single capacitor, it should be appreciated that any combination of a number of capacitors can be used to create the feedback capacitance Cf. One advantage of implementing the feedback capacitor Cf is that the dynamic range of the receiver 112 can be maintained at a desirable amount (e.g., 30 dBΩ) even when operating between the extremes of the minimum gain Gmin and maximum gain Gmax.

Figure 6A:
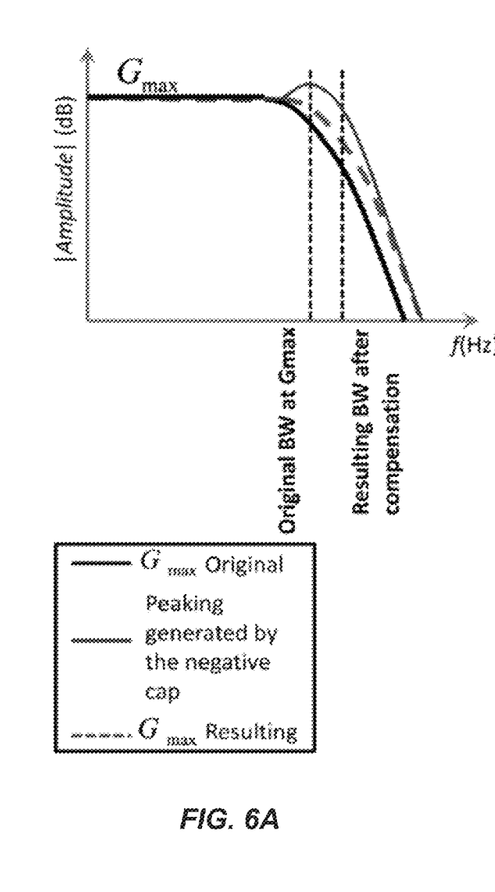
FIG. 6A is a chart illustrating the frequency response of a linear optical receiver at a high gain value when implementing a receiver circuit in accordance with at least some embodiments of the present disclosure.

When the gain is at or near the maximum gain Gmax, the input capacitance Cin introduced by the positive feedback loop composed of the variable gain amplifier 316 and the feedback capacitance Cf to the previous stage (e.g., the TIA 308), is given by the Miller theorem as: Cin=Cf(1−Gmax); where Gmax is assumed to be greater than 1. Because the maximum gain Gmax is larger than 1, the input capacitance Cin will be negative in this scenario, thereby reducing the total capacitance at the node between the TIA 308 and the variable gain amplifier 316 (e.g., at node A). Reducing the total capacitance at node A generates a peaking in the transfer function of that node A, thereby increasing the overall bandwidth of the variable gain amplifier 316 as can be seen in FIG. 6A. Another way to look at the input capacitance Cin in this scenario (where the input capacitance Cin is negative) is that the creation of the negative capacitance effectively creates an inductance for the positive feedback loop, which speeds up the operation of the circuit 504.

Figure 6B:
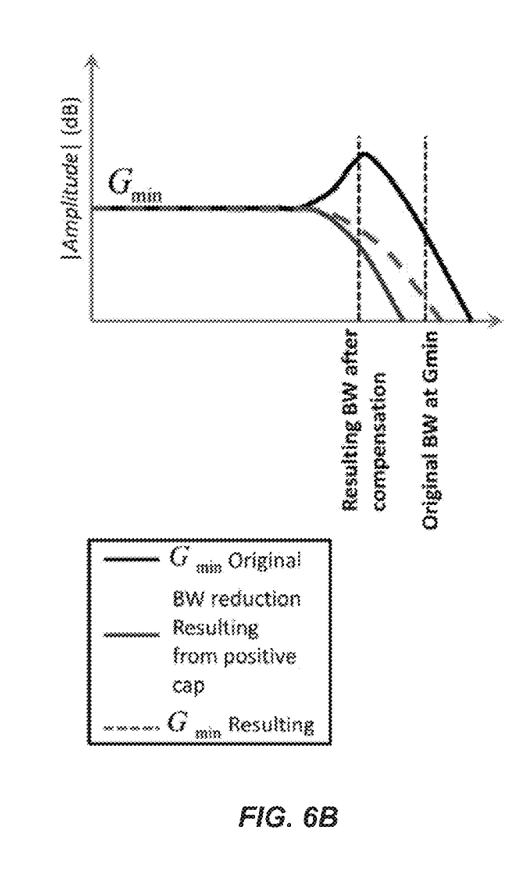
FIG. 6B is a chart illustrating the frequency response of a linear optical receiver at a low gain value when implementing a receiver circuit in accordance with at least some embodiments of the present disclosure.

On the other hand, when the gain is at or near the minimum gain Gmin, the similar equation described above can be used to determine the input capacitance Cin: Cin=Cf(1−Gmin); where Gmin is assumed to be less than or equal to 1. This creates a positive input capacitance Cin, which effectively adds a capacitor to the node A, thereby reducing the bandwidth at the node A and reducing the peaking as shown in FIG. 6B.

As can be seen from the above, by introducing the feedback capacitance Cf into the feedback loop of the variable gain amplifier 316, the effective operating bandwidth of the circuit 300 can be extended and the deleterious effects of peaking (when operating at or near the minimum gain Gmin) can also be addressed. Utilization of the feedback capacitance Cf effectively helps extend the bandwidth of the receiver 112 between the minimum gain Gmin and the maximum gain Gmax.

Figure 5B:
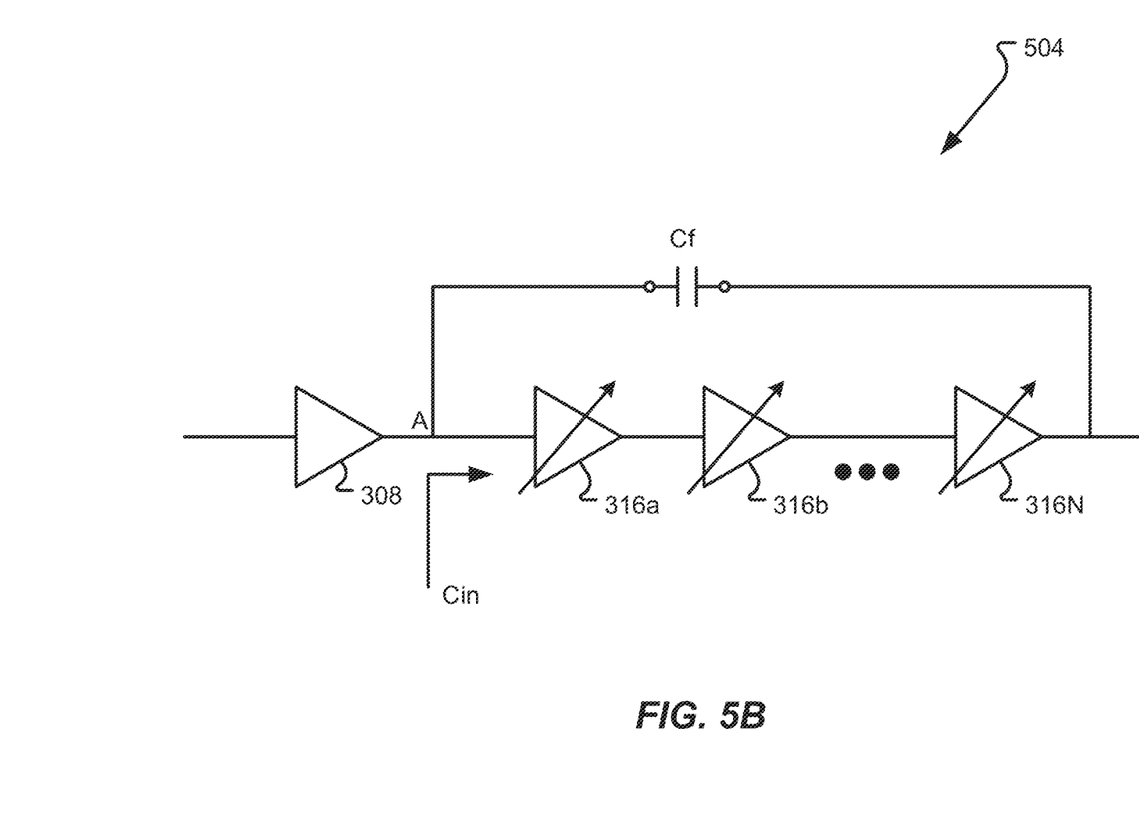
FIG. 5B is a circuit diagram depicting an alternative arrangement of the illustrative circuit for curtailing the undesired frequency response shown in FIG. 4 in accordance with at least some embodiments of the present disclosure.
Figure 5C:
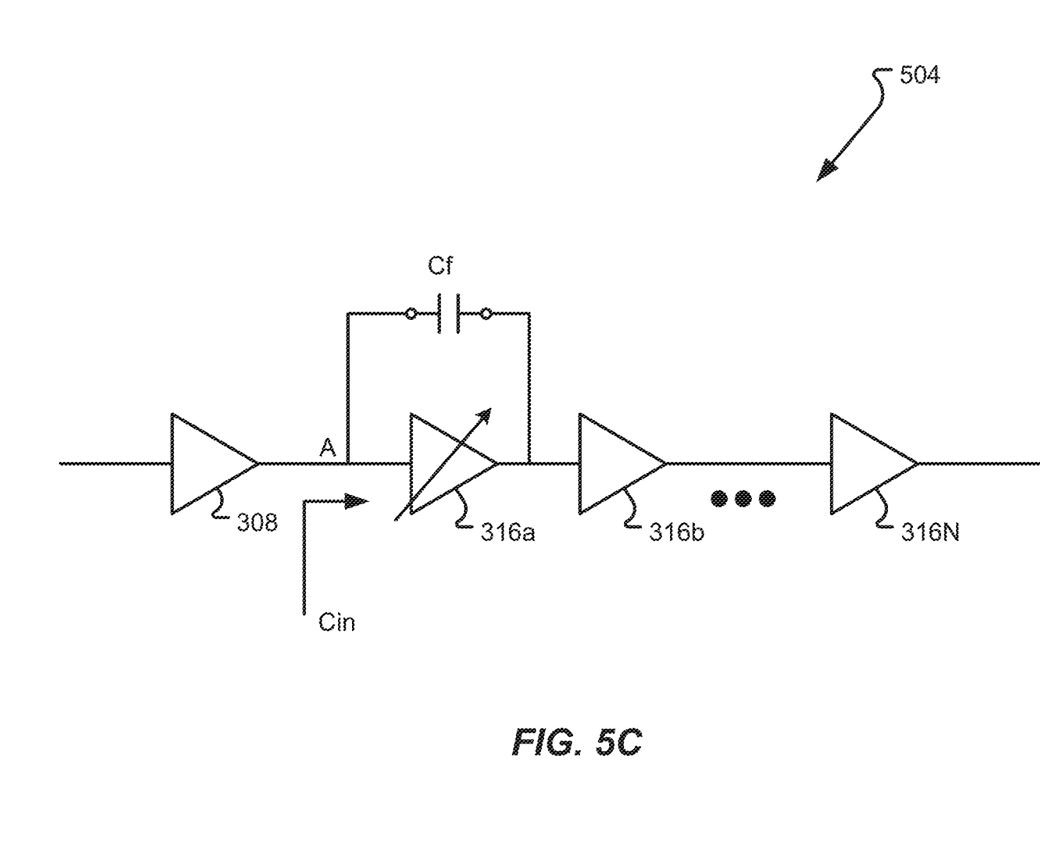
FIG. 5C is a circuit diagram depicting yet another alternative arrangement of the illustrative circuit for curtailing the undesired frequency response shown in FIG. 4 in accordance with at least some embodiments of the present disclosure.
Figure 5D:
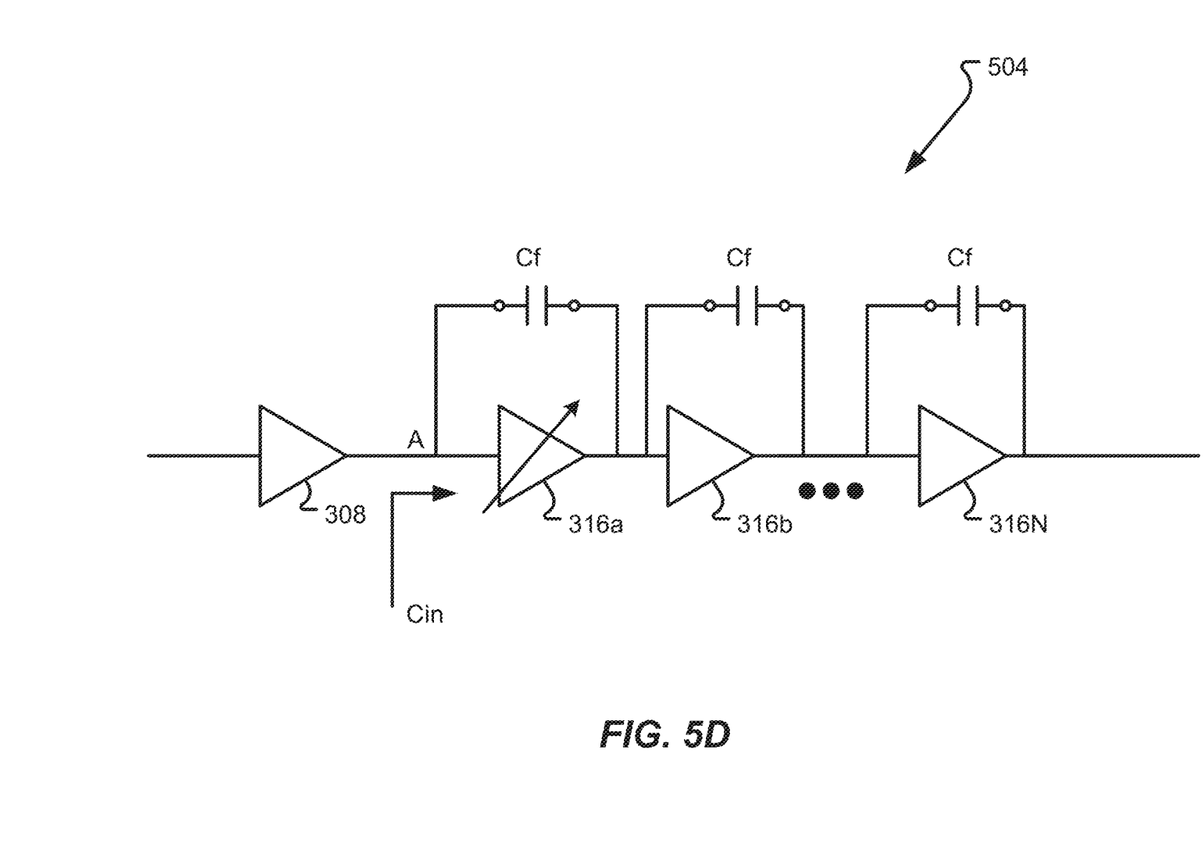
FIG. 5D is a circuit diagram depicting still another alternative arrangement of the illustrative circuit for curtailing the undesired frequency response shown in FIG. 4 in accordance with at least some embodiments of the present disclosure.

FIGS. 5B-D depict other variations of the circuit 504 that can provided similar results to the circuit 504 depicted in FIG. 5A. In particular, the circuit 504 configuration depicted in FIG. 5B shows that a feedback capacitance Cf can be applied across a plurality or all of the variable gain amplifiers 316a-N in the second amplification stage. Alternatively or additionally, a feedback capacitance Cf may be applied across one of the variable gain amplifiers (e.g., the first variable gain amplifier 316a) without being applied across others of the variable gain amplifiers in the second amplification stage as shown in FIG. 5C. Alternatively or additionally, individual feedback capacitances Cf may be applied across individual ones of the variable gain amplifiers 316a-N in the second amplification stage as shown in FIG. 5D. In this particular configuration, the feedback capacitance Cf applied across one of the variable gain amplifiers may be the same as or different from the feedback capacitance Cf applied across another one of the variable gain amplifiers. In other words, the individual feedback capacitance Cf values may be the same as one another or different from one another without departing from the scope of the present disclosure.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An optical communication system, comprising:
   a photodiode configured to receive light energy and convert the light energy into an electrical signal;
   a first amplification stage that receives the electrical signal output by the photodiode and produces a first amplified output of the electrical signal received from the photodiode;
   a second amplification stage that receives the first amplified output of the first amplification stage and produces a second amplified output of the first amplified output received from the first amplification stage;
   a gain controller that controls a gain of the second amplification stage based on a control signal input to the second amplification stage; and
   at least one capacitive element that extends a bandwidth of the second amplified output at a maximum gain of the second amplification stage and also reduces a peaking of the second amplified output at a minimum gain of the second amplification stage.

2. The optical communication system of claim 1, wherein the first amplification stage comprises a transimpedance amplifier, and wherein the gain controller includes a peak detector that detects peaks and valleys of a feedback signal that is based on the second amplified output, and an integrator that generates the control signal based on a reference voltage and the detected peaks and valleys.

3. The optical communication system of claim 2, wherein the second amplification stage comprises at least one variable gain amplifier.

4. The optical communication system of claim 3, wherein the at least one capacitive element comprises a feedback capacitor connected in a feedback loop across the second amplification stage.

5. The optical communication system of claim 4, wherein the feedback capacitor adds a capacitance to a node between the first amplification stage and the second amplification stage and wherein the capacitance added to the node between the first amplification stage and the second amplification stage is a positive capacitance when the minimum gain of the second amplification stage is less than one thereby reducing bandwidth at the node and reducing peaking of a transfer function at the node.

6. The optical communication system of claim 2, wherein the second amplification stage comprises a plurality of variable gain amplifiers.

7. The optical communication system of claim 6, wherein the at least one capacitive element comprises a feedback capacitor connected across a single one of the plurality of variable gain amplifiers.

8. The optical communication system of claim 6, wherein a feedback capacitor is connected across a first variable gain amplifier in the second amplification stage and not across a second variable gain amplifier in the second amplification stage.

9. A linear optical receiver, comprising:
a first amplification stage that receives an electrical signal output by a photodiode and produces a first amplified output of the electrical signal received from the photodiode;
a second amplification stage phase that receives the first amplified output of the first amplification stage and produces a second amplified output of the first amplified output received from the first amplification stage;
a gain controller that controls a gain of the second amplification stage based on a control signal input to the second amplification stage; and
at least one capacitive element that extends a bandwidth of the second amplified output at a maximum gain of the second amplification stage and also reduces a peaking of the second amplified output at a minimum gain of the second amplification stage.

10. The linear optical receiver of claim 9, wherein the second amplification stage comprises at least one variable gain amplifier.

11. The linear optical receiver of claim 10, wherein the first amplification stage comprises a transimpedance amplifier.

12. The linear optical receiver of claim 10, wherein the at least one capacitive element comprises a feedback capacitor connected in a feedback loop across the at least one variable gain amplifier.

13. The linear optical receiver of claim 10, wherein the at least one variable gain amplifier comprises a plurality of variable gain amplifiers.

14. The linear optical receiver of claim 13, wherein the at least one capacitive element comprises a feedback capacitor connected across a single one of the plurality of variable gain amplifiers.

15. The linear optical receiver of claim 13, wherein a feedback capacitor is connected across a first variable gain amplifier in the second amplification stage and not across a second variable gain amplifier in the second amplification stage.

16. The linear optical receiver of claim 9, wherein a feedback capacitor is provided that adds a capacitance to a node between the first amplification stage and the second amplification stage and wherein the capacitance added to the node between the first amplification stage and the second amplification stage is a positive capacitance when the minimum gain of the second amplification stage is less than one thereby reducing bandwidth at the node and reducing peaking of a transfer function at the node.

17. An Integrated Circuit (IC) chip, comprising:
a transimpedance amplifier configured to receive an input electrical signal from a photodiode and provide a first amplified signal that is an amplified version of the input electrical signal as an output;
at least one variable gain amplifier that receives the first amplified signal output by the transimpedance amplifier and outputs a second amplified signal;
a gain controller that controls a gain of the at least one variable gain amplifier based on a control signal input to the at least one variable gain amplifier; and
at least one capacitive element that extends a bandwidth of the second amplified signal at a maximum gain of the at least one variable gain amplifier and also reduces a peaking of the second amplified signal at a minimum gain of the at least one variable gain amplifier.

18. The IC chip of claim 17, wherein the at least one capacitive element comprises a feedback capacitor connected in a feedback loop across the at least one variable gain amplifier.

19. The IC chip of claim 18, wherein the at least one variable gain amplifier comprises a plurality of series-connected variable gain amplifiers.

20. The IC chip of claim 19, wherein the feedback capacitor is connected across a single one of the plurality of series-connected variable gain amplifiers.

* * * * *